(12) United States Patent
Balimann et al.

(10) Patent No.: US 11,114,573 B2
(45) Date of Patent: Sep. 7, 2021

(54) OPTOELECTRONIC MODULE ASSEMBLY AND MANUFACTURING METHOD

(71) Applicant: ams Sensors Singapore Pte. Ltd., Singapore (SG)

(72) Inventors: Martin Lukas Balimann, Singapore (SG); Matthias Gloor, Boswil (CH); Philippe Bouchilloux, Singapore (SG); Jukka Alasirnio, Singapore (SG); Hartmut Rudmann, Jona (CH); Nicola Spring, Ziegelbrücke (CH)

(73) Assignee: ams Sensors Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/719,194

(22) Filed: Dec. 18, 2019

(65) Prior Publication Data
US 2020/0127147 A1 Apr. 23, 2020

Related U.S. Application Data

(63) Continuation of application No. 16/086,868, filed as application No. PCT/SG2017/050148 on Mar. 23, 2017, now Pat. No. 10,566,468.

(Continued)

(51) Int. Cl.
*H01L 31/02* (2006.01)
*H01L 31/0203* (2014.01)
(Continued)

(52) U.S. Cl.
CPC .... *H01L 31/0203* (2013.01); *H01L 27/14618* (2013.01); *H01L 27/14625* (2013.01);
(Continued)

(58) Field of Classification Search
CPC ..... H01L 31/02; H01L 31/18; H01L 31/0203; H01L 31/024; H01L 31/0232;
(Continued)

(56) References Cited

U.S. PATENT DOCUMENTS

2005/0013562 A1 1/2005 Tatehata et al.
2005/0185088 A1* 8/2005 Kale ................ H01L 27/14623
348/374

(Continued)

FOREIGN PATENT DOCUMENTS

GB 2417826 3/2006
TW 201801331 A 1/2018
(Continued)

OTHER PUBLICATIONS

ISA/SG, International Search Report for PCT/SG2017/050148 dated May 30, 2017.
(Continued)

*Primary Examiner* — Chuong A Luu
(74) *Attorney, Agent, or Firm* — Michael Best and Friedrich LLP

(57) ABSTRACT

An optoelectronic module assembly includes an optoelectronic module. The module includes: an active optoelectronic component in or on a mounting substrate, an optical sub-assembly, and a spacer disposed between the mounting substrate and the optical sub-assembly so as to establish a particular distance between the active optoelectronic component and the optical sub-assembly. The optoelectronic module assembly also includes a recessed substrate including first and second surfaces, wherein the second surface is in a plane closer to the optical sub-assembly than is the first surface. The optoelectronic module is mounted on the first surface. The second surface is for mounting other components.

3 Claims, 5 Drawing Sheets

Related U.S. Application Data

(60) Provisional application No. 62/312,026, filed on Mar. 23, 2016.

(51) Int. Cl.

| | | |
|---|---|---|
| *H01L 27/146* | (2006.01) | |
| *H01L 31/0232* | (2014.01) | |
| *H05K 1/02* | (2006.01) | |
| *H01S 5/023* | (2021.01) | |
| *H01S 5/0233* | (2021.01) | |
| *H01S 5/0235* | (2021.01) | |
| *H01S 5/02253* | (2021.01) | |
| *H01L 31/024* | (2014.01) | |
| *H01L 33/48* | (2010.01) | |
| *H01L 33/58* | (2010.01) | |
| *H01L 33/62* | (2010.01) | |
| *H01L 33/64* | (2010.01) | |
| *H01L 51/52* | (2006.01) | |
| *H01S 5/02208* | (2021.01) | |
| *H01S 5/024* | (2006.01) | |
| *H01L 31/18* | (2006.01) | |

(52) U.S. Cl.
CPC ...... *H01L 27/14636* (2013.01); *H01L 31/024* (2013.01); *H01L 31/02005* (2013.01); *H01L 31/02019* (2013.01); *H01L 31/02325* (2013.01); *H01L 31/02327* (2013.01); *H01L 33/483* (2013.01); *H01L 33/58* (2013.01); *H01L 33/62* (2013.01); *H01L 33/647* (2013.01); *H01L 51/529* (2013.01); *H01L 51/5237* (2013.01); *H01L 51/5275* (2013.01); *H01S 5/023* (2021.01); *H01S 5/0233* (2021.01); *H01S 5/0235* (2021.01); *H01S 5/02208* (2013.01); *H01S 5/02253* (2021.01); *H01S 5/02469* (2013.01); *H05K 1/021* (2013.01); *H01L 27/14685* (2013.01); *H01L 31/18* (2013.01); *H01L 33/48* (2013.01); *H01L 2933/0033* (2013.01); *H01L 2933/0058* (2013.01); *H01L 2933/0066* (2013.01); *H01L 2933/0075* (2013.01); *H05K 2201/10106* (2013.01); *H05K 2201/10121* (2013.01); *H05K 2203/049* (2013.01)

(58) Field of Classification Search
CPC ......... H01L 31/02327; H01L 31/02019; H01L 31/02005; H01L 31/02325; H01L 33/48; H01L 33/62; H01L 33/64; H01L 33/58; H01L 33/483; H01L 33/647; H01L 27/146; H01L 27/14618; H01L 27/14636; H01L 27/14625; H01L 27/14621; H01L 27/14685; H01L 27/14687; H01L 2933/00; H01L 2933/0033; H01L 2933/0058; H01L 2933/0066; H01L 2933/0075; H01L 51/52; H01L 51/529; H01L 51/5237; H01L 51/5275; H01L 31/12; H01L 31/173; H01L 27/14; H05K 1/02; H05K 1/021; H05K 1/0235; H01S 5/022; H01S 5/023; H01S 5/024; H01S 5/0233; H01S 5/02253; H01S 5/02469; H01S 5/02288; H01S 5/02236; H01S 5/02208
USPC .......................................................... 257/98
See application file for complete search history.

(56) References Cited

U.S. PATENT DOCUMENTS

| | | | |
|---|---|---|---|
| 2006/0006486 A1 | 1/2006 | Seo et al. | |
| 2007/0117236 A1* | 5/2007 | Nagasaka | H01L 24/83 438/29 |
| 2008/0111949 A1 | 5/2008 | Shibata et al. | |
| 2012/0018830 A1 | 1/2012 | Lin et al. | |
| 2013/0023072 A1* | 1/2013 | Kriman | H01L 23/481 438/28 |
| 2013/0037831 A1* | 2/2013 | Rudmann | H01L 27/14625 257/88 |
| 2016/0056194 A1* | 2/2016 | Rudmann | H01L 27/14618 257/98 |
| 2017/0317758 A1 | 11/2017 | Dedobbelaere et al. | |

FOREIGN PATENT DOCUMENTS

| | | |
|---|---|---|
| WO | 2015/038064 | 3/2015 |
| WO | 2015/126328 | 8/2015 |

OTHER PUBLICATIONS

Office Action issued from the Taiwan Patent office for related Application No. 106109795 dated Dec. 17, 2020 (18 pages including English Translation).

\* cited by examiner

OPTOELECTRONIC MODULE ASSEMBLY AND MANUFACTURING METHOD

CROSS-REFERENCE TO RELATED APPLICATIONS

This application is a continuation of U.S. patent application Ser. No. 16/086,868, filed Sep. 20, 2018, which is a National Stage Entry of Application No. PCT/SG2017/050148, filed Mar. 23, 2017, which claims the benefit of priority of U.S. Provisional Patent Application No. 62/312,026, filed on Mar. 23, 2016. The contents of the prior applications are incorporated by reference herein in their entirety.

TECHNICAL FIELD

The present disclosure relates to optoelectronic module assemblies, and methods for making such assemblies.

BACKGROUND

Optoelectronic modules that include an optical radiation emitter and/or an optical sensor can be used in a wide range of applications including, for example, distance measurement, proximity sensing, gesture sensing, and imaging. In some applications, such optoelectronic modules are included in the housings of various consumer electronics, such as mobile computing devices, (e.g., tablets and personal data assistants (PDAs), smart phones) and other devices.

Space, however, often is at a premium in the type of devices into which the modules are to be integrated. This issue can be particularly important, for example, to smart phone manufacturers as well as manufactures of other electronic appliances and systems in which space is at a premium. Thus, it is desirable to provide modules that are compact and that are relatively easy to manufacture.

SUMMARY

The present disclosure describes optoelectronic module assemblies, and methods for making such assemblies.

In some instances, the methods can facilitate the fabrication of an optoelectronic module that has electrical contacts to permit active alignment of the optoelectronic device. The methods also can facilitate the fabrication of an assembly that incorporates the optoelectronic module and that has a relatively small z-height.

In one aspect, for example, the disclosure describes an optoelectronic module assembly that includes an optoelectronic module. The module includes an active optoelectronic component in or on a mounting substrate, an optical sub-assembly, and a spacer disposed between the mounting substrate and the optical sub-assembly so as to establish a particular distance between the active optoelectronic component and the optical sub-assembly. The optoelectronic module assembly also includes a recessed substrate including first and second surfaces, wherein the second surface is in a plane closer to the optical sub-assembly than is the first surface. The optoelectronic module is mounted on the first surface. The second surface is for mounting other components.

Some implementations include one or more of the following features. For example, the recessed substrate can include a first portion and a second portion, the second portion of the recessed substrate being composed of a material having higher thermal conductivity than the first portion. A surface of the second portion serves as the first surface on which the active optoelectronic component is mounted. The first portion is disposed on the second portion, but does not cover the first surface.

In some cases, the first portion of the recessed substrate includes a printed circuit board.

In some instances, the second portion of the recessed substrate is composed of a metal or ceramic material. In some implementations, the second portion of the recessed substrate is at least partially composed of electrically conductive material.

The optoelectronic module assembly can include first electrical contacts on a first surface of the mounting substrate, as well as second electrical contacts disposed on a second, opposite surface of the mounting substrate, where the second surface of the mounting substrate is closer to the first surface of the recessed substrate than is the first surface of the mounting substrate.

In some implementations, a filler material is disposed between the second surface of the mounting substrate and the first surface of the recessed substrate. The filler material preferably has good thermal conductivity and/or good heat capacity. Further, in some instances, an electrically insulating material substantially fills a space between the second portion of the recessed substrate and the mounting substrate.

The spacer can include electrically insulating mounting protrusions that project beyond the mounting substrate, wherein the mounting protrusions are attached via adhesive to the first surface of the recessed substrate. In some instances, the spacer includes alignment protrusions in contact with the active optoelectronic component.

The disclosure also describes an optoelectronic module that includes an active optoelectronic component in or on a mounting substrate, an optical sub-assembly, and a spacer. The mounting substrate has a first surface and has a second surface on an opposite side from the first surface. The spacer is disposed between the mounting substrate and the optical sub-assembly so as to establish a particular distance between the active optoelectronic component and the optical sub-assembly. First electrical contacts are disposed on the first surface of the mounting substrate, and second electrical contacts are disposed on the second surface of the mounting substrate.

In accordance with a further aspect, the disclosure describes a method for manufacturing an optoelectronic module assembly. The method includes establishing electrical contact to an active optoelectronic component in or on a first side of a mounting substrate, wherein the electrical contact is established via electrical contacts on a second side of the mounting substrate opposite that of the first side. The method further includes performing active alignment to align an optical sub-assembly substantially with the active optoelectronic component, wherein the active alignment is performed while the electrical contact to the active optoelectronic component is maintained. The optoelectronic assembly is mounted on a recessed area of a substrate, and electrical contact is established to the active optoelectronic component via electrical contacts on the first side of the mounting substrate.

Other aspects, features and advantages will be apparent from the following detailed description, the accompanying drawings, and the claims.

DETAILED DESCRIPTION

This disclosure describes a method that can facilitate the fabrication of an optoelectronic module that has electrical contacts to permit active alignment of the optoelectronic device. The method also can facilitate the fabrication of an assembly that incorporates the optoelectronic module and that has a relatively small z-height.

Figure 1A:
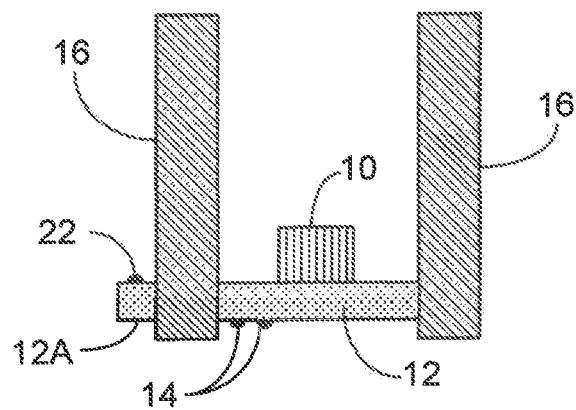
FIGS. 1A-1E illustrate various stages during manufacture of an optoelectronic module assembly.
Figure 1B:
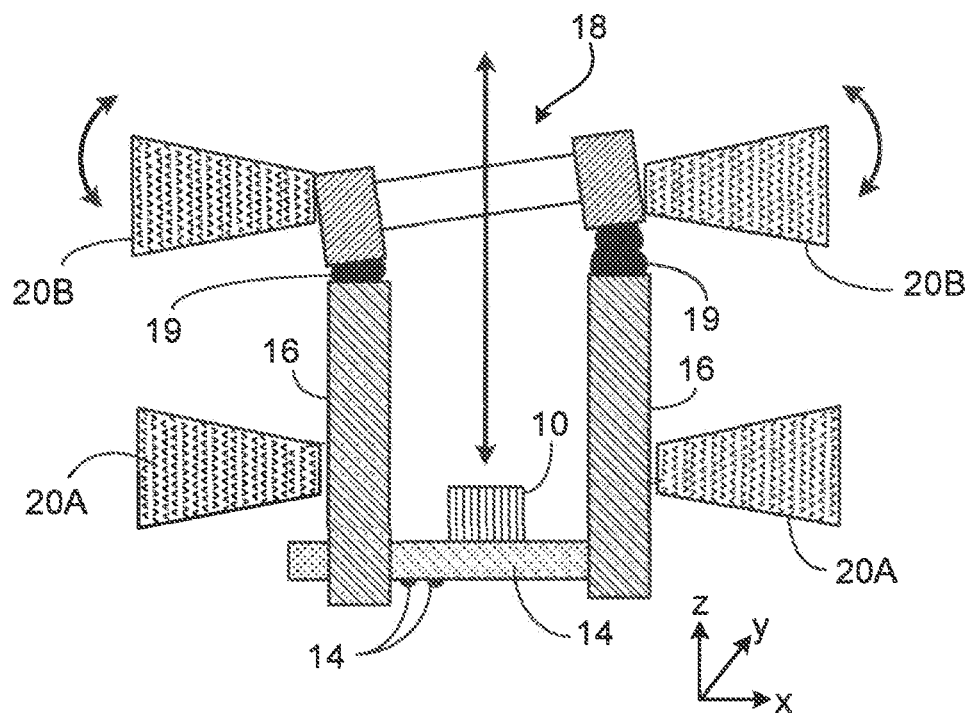
Figure 1C:
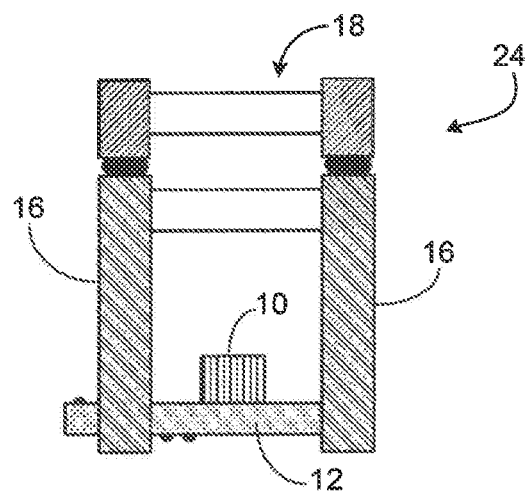
Figure 1D:
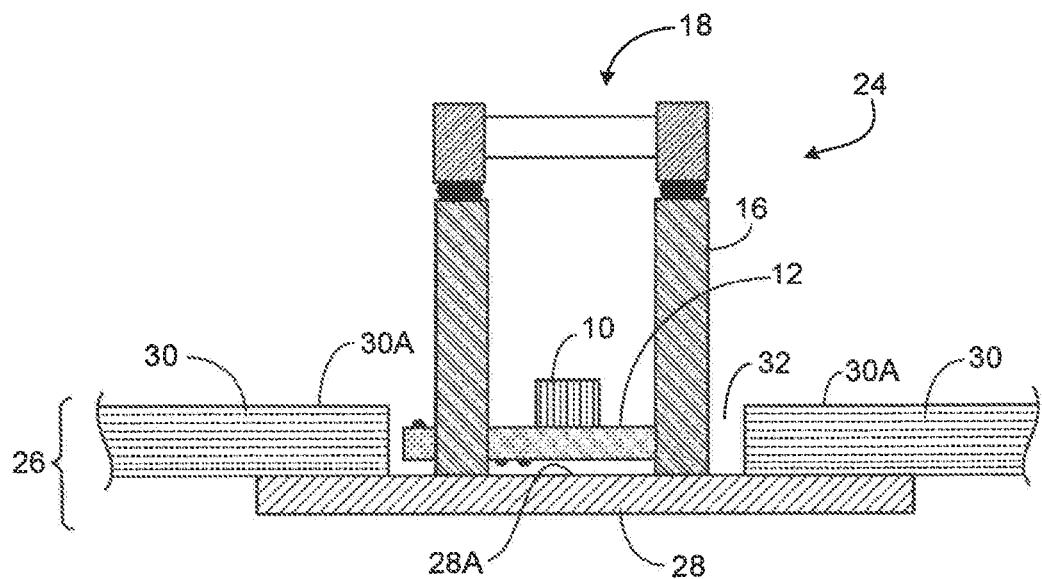
Figure 1E:
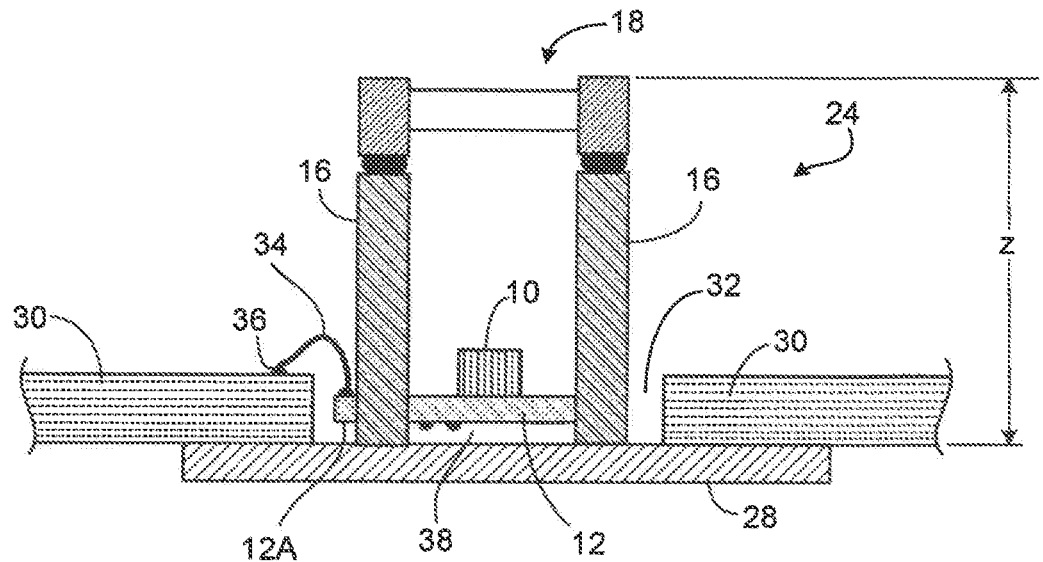

FIGS. 1A-1E illustrate an example of various stages in the manufacture of an optoelectronic module assembly in accordance with some implementations. In particular, FIGS. 1A-1C illustrate stages in the fabrication of an optoelectronic module, and FIGS. 1D-1E illustrate integration of the module into an assembly.

As shown in FIG. 1A, an active optoelectronic device 10 is mounted on a first surface of a mounting substrate 12 such as a lead frame, printed circuit board (PCB) or ceramic board having conductive wiring. The optoelectronic device 10 can be implemented, for example, as an optical emitter chip such as a light emitting diode (LED), infra-red (IR) LED, organic LED (OLED), infra-red (IR) laser, vertical cavity surface emitting laser (VCSEL), or other optical radiation source. In other instances, the optoelectronic device 10 is implemented, for example, as an optical sensor chip such as a time-of-flight (TOF) optical sensor chip or other image sensor chip (e.g., a CMOS or CCD image sensor) that includes an array of light sensitive pixels. The second (bottom) surface of the mounting substrate 12 includes electrical contacts (e.g., bond pads) 14 that are connected electrically to the optoelectronic device 10 by wiring in the mounting substrate 12.

As further shown in FIG. 1A, a spacer 16 laterally encircles the optoelectronic device 10. The spacer 16 serves as outer sidewalls of the module and establishes a specified distance between the optoelectronic device 10 and an optical sub-assembly 18 disposed over the optoelectronic device 10 (see FIG. 1B). The spacer also can help establish optical alignment between the optoelectronic device 10 and the optical sub-assembly 18. The spacer 16 can be formed, for example, by a vacuum injection or other molding technique.

In some instances, a portion 12A of the mounting substrate 12 extends laterally slightly beyond the outer surface of the spacer 16. This portion 12A of the mounting substrate 12 can have electrical contacts (bond pads) 22 on its upper surface (i.e., on the same surface on which the device 10 is mounted). The contacts 22 can be used, for example, to establish electrical contact to the device 10 after it is integrated into an assembly as described below.

Next, as shown in FIG. 1B, the optical sub-assembly 18 is attached to free end(s) of the spacer 16 using an adhesive 19 such as glue. The optical sub-assembly 18 can include one or more passive optical elements such as lenses. Prior to curing the adhesive or allowing it to harden, robotic micro grippers 20A, 20B can be used to perform active alignment of the optical sub-assembly 18 with respect to the device 10. One micro gripper 20A holds the spacer 16 in position, while the second gripper 20B moves the optical sub-assembly to achieve proper alignment. To facilitate the active alignment, the back side contacts 14 can be used to power on the device 10, to provide control signals to the device 10, and/or to receive output signals from the device 10. The alignment correction can be performed to provide proper focus and alignment in the x, y, z and rotational directions.

After completing the active alignment, the adhesive can be cured or allowed to harden, and the micro gripper 20 can be removed. The electrical contact to the device 10 via the back side contacts 14 can be disestablished. The resulting module 24 is illustrated in FIG. 1C. In subsequent fabrication stages, as described below, the module 24 is incorporated into an optoelectronic module assembly.

As illustrated in FIG. 1D, the module 24 is mounted on a recessed substrate 26 that has surfaces for mounting components at two different heights. In the illustrated example, the recessed substrate 26 includes a first substantially planar portion 30 attached to a second substantially planar portion 28, such that the second portion 28 provides a first, lower surface 28A for mounting the module 24, and the first portion 30 provides a second higher surface 30A for mounting other electronic components. The two surfaces 28A, 30A are substantially parallel to one another.

The first portion 30 of the recessed substrate 26 can be composed, for example, of a PCB material such as FR4, which is a grade designation assigned to glass-reinforced epoxy laminate sheets, tubes, rods and PCBs, and is a composite material composed of woven fiberglass cloth with an epoxy resin binder that is flame resistant. Such PCB materials have a relatively low thermal conductivity (e.g., ~0.25 W/mK at 20° C.). On the other hand, preferably, the second portion 28 of the recessed substrate 26 has good thermal properties (i.e., thermal conductivity and/or thermal capacity higher than the first portion 30) to facilitate heat dissipation. Thus, the second portion 28 can be composed, for example, of a metal or ceramic material, and in some instances provides a rigid casing for the assembly. As an example, in some implementations, the second portion 28 of the recessed substrate 26 is a metal composed of aluminum (Al) (thermal conductivity of 200 W/m K at 20° C.), or copper (Cu) (thermal conductivity of ~400 W/m K at 20° C.). In some implementations, the second portion 28 is a ceramic composed of aluminum nitride (AlN) (thermal conductivity of 80-200 W/m K at 20° C.). Other materials can be used for the second portion as well.

In the illustrated example, the PCB 30 has a recess 32 such that the module 24 can be mounted within the recess 32 directly on the second portion 28. Thus, the first portion 30 (e.g., the PCB) does not cover the surface 28A of the second portion 28 where the module 24 is attached. By mounting the module 24 directly on the second portion 28 (e.g., with adhesive) rather than on the PCB 30, the overall z-height of the assembly can be reduced.

Next, as shown in FIG. 1E, electrical connections (e.g., conductive wiring) 34 can be provided between the electrical contacts 22 on the mounting substrate 12 and electrical contacts (e.g., bond pads) 36 on the PCB 30. In some instances, a module manufacturer fabricates modules as illustrated in FIGS. 1A-1C, whereas another manufacturer assembles the module into an assembly as illustrated in FIGS. 1D-1E. In other instances, the same manufacturer may perform all fabrication stages as illustrated in FIGS. 1A-1E.

Figure 2:
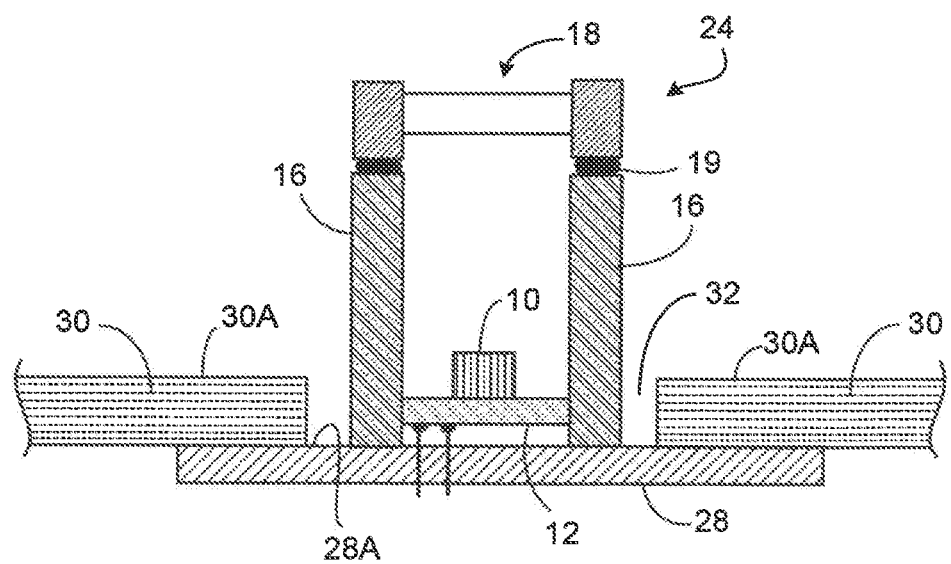
FIGS. 2, 3 and 4 illustrate examples of optoelectronic module assemblies.

In some implementations, the electrical contacts 22 on the device-side of the mounting substrate 12 can be omitted. Instead, electrical connections can be provided from the electrical contacts 14 on the underside of the mounting substrate 12 to an exterior surface of the second portion 28 of the recessed substrate 26. In such circumstances, it also is possible to omit the portion 12A of the mounting substrate 12 that extends beyond the outer surface of the spacer 16. FIG. 2 illustrates an example of such an implementation.

As illustrated in the implementations of FIGS. 1E and 2, the spacer 16 extends slightly beyond the lower surface of the mounting substrate 12 such that there is space between the lower surface of the mounting substrate 12 and the upper surface of the second portion 28 of the recessed substrate 26. The spacer 16 advantageously can be composed of an electrically insulating material. In some instances, the space 38 between the lower surface of the mounting substrate 12 and the upper surface of the second portion 28 of the recessed substrate 26 can be filled substantially with a material that is electrically insulating and/or has relatively high thermal conductivity and/or thermal capacity.

Figure 3:
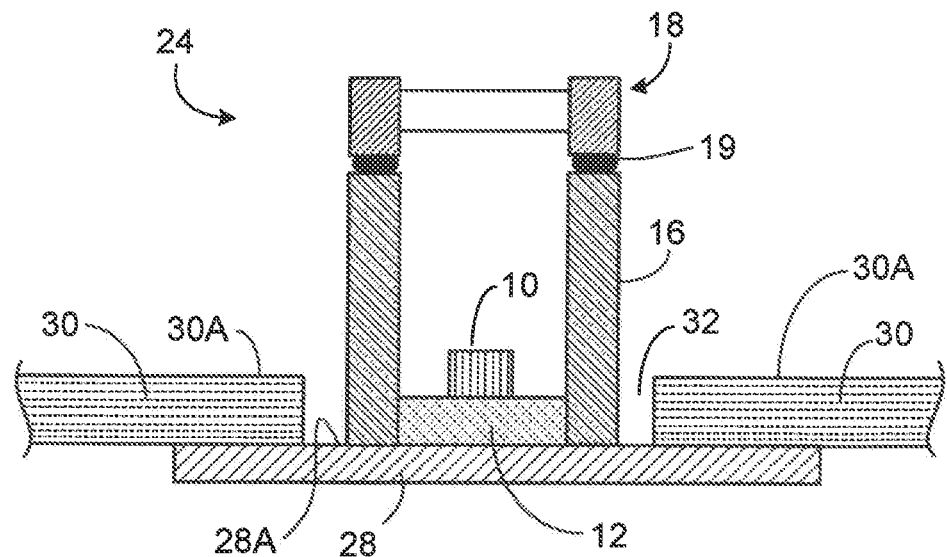
Figure 4:
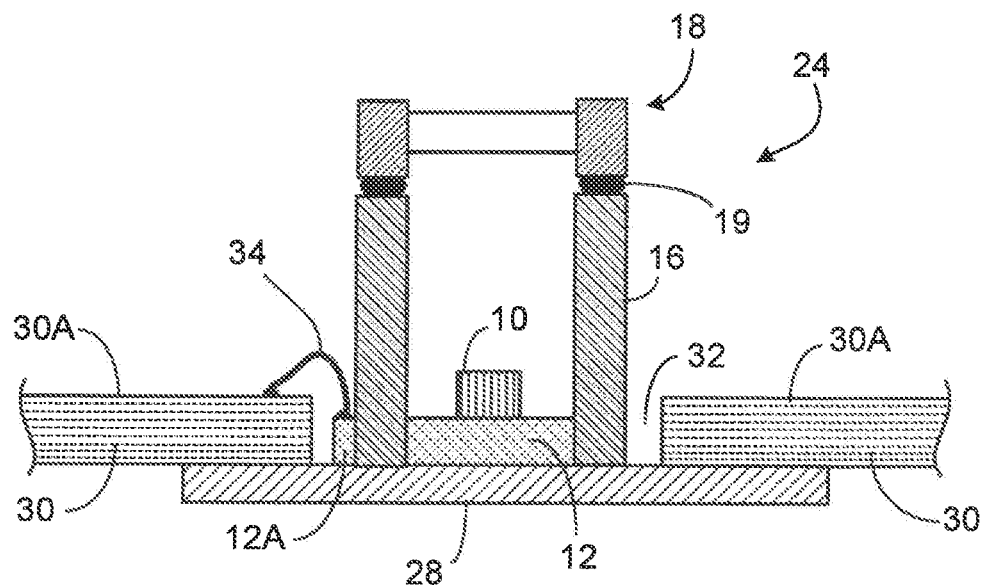

In some instances, the mounting substrate 12 rests directly on the second portion 28 of the recessed substrate 26, as shown, for example, in FIGS. 3 and 4.

Figure 5C:
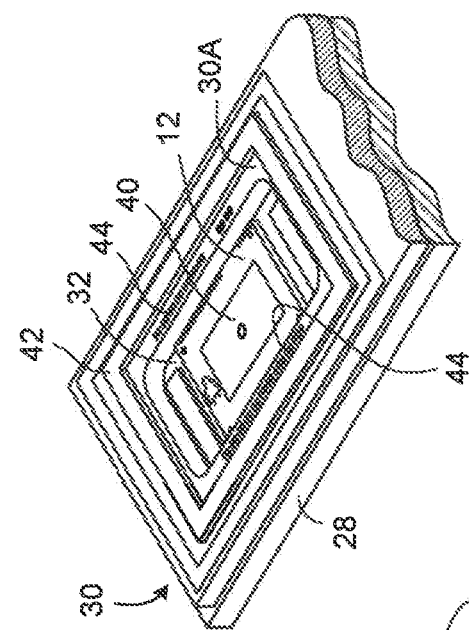
FIG. 5C illustrates a portion of the optoelectronic module assembly of FIGS. 5A-5B.
Figure 5A:
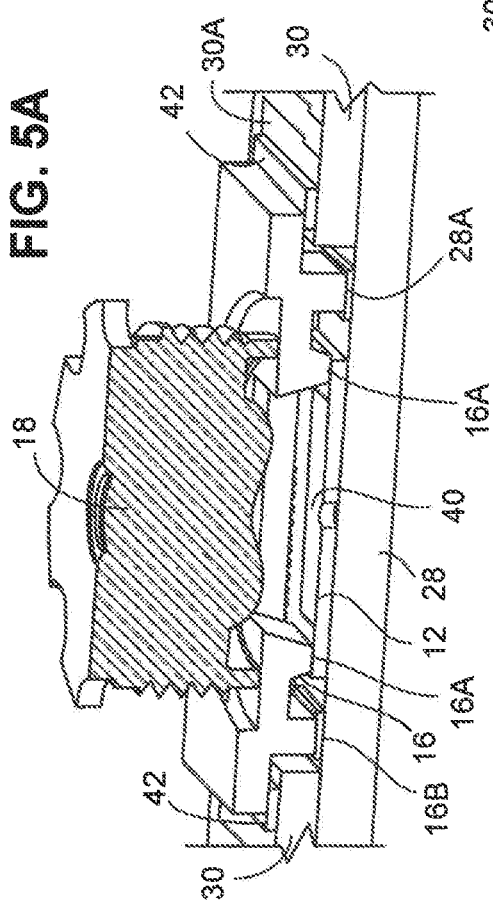
FIGS. 5A-5B illustrate another example of an optoelectronic module assembly.
Figure 5B:
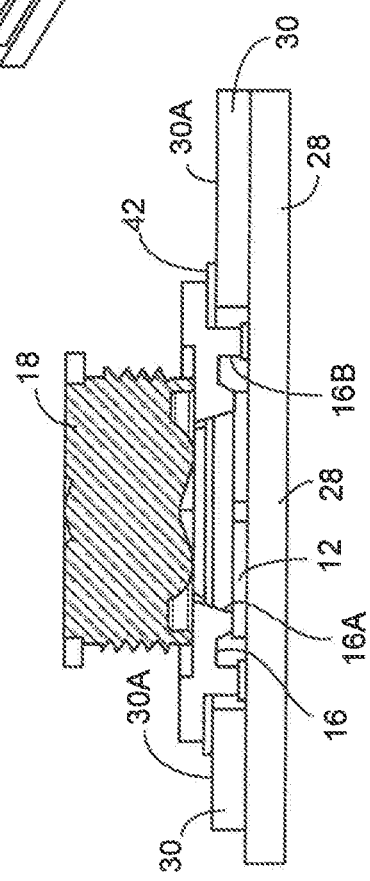

Further, as shown in FIGS. 5A-5C, in some implementations, the optoelectronic device 10 can be implemented as semiconductor-based light emitting or photosensitive elements 40 formed in the substrate 12 itself rather than being implemented as a separate chip mounted on the substrate 12. In the illustrated example, the spacer 16 includes alignment protrusions 16A that rest directly (without adhesive) on the surface of the device 10. The spacer 16 also includes mounting protrusions 16B that are attached (e.g., by adhesive) to the surface of the second portion 28 of the recessed substrate 26. Such an arrangement can facilitate establishing a more precise distance between the light emitting or photosensitive elements 40 and the passive optical elements (e.g., lenses) of the optical sub-assembly 18. The spacer 16 also can be attached (e.g. by adhesive 42) to the surface 30A of the PCB 30. FIG. 5C illustrates a portion of the optoelectronic module assembly—with the spacer 16 and the optical sub-assembly 18 removed—so that the active optoelectronic device 10 can be seen resting within the recessed opening 32 of the PCB 30 (on the second portion 28 of the recessed substrate 26). Additional electronic components 44 can be provided on the surface 30A of the PCB 30.

Although various embodiments have been described, modifications can be made within the spirit of the disclosure. Further, features described in connection with different embodiments can be included in the same implementation in some instances. Accordingly, other implementations are within the scope of the claims.

What is claimed is:

1. An optoelectronic module comprising:
   an active optoelectronic component in or on a mounting substrate, the mounting substrate having a first surface and having a second surface on an opposite side from the first surface;
   an optical sub-assembly;
   a spacer disposed between the mounting substrate and the optical sub-assembly so as to establish a particular distance between the active optoelectronic component and the optical sub-assembly;
   first electrical contacts disposed on the first surface of the mounting substrate; and
   second electrical contacts disposed on the second surface of the mounting substrate;
   wherein the first and second electrical contacts are configured to permit active alignment of the active optoelectronic component and the optical sub-assembly.

2. The optoelectronic module of claim 1, wherein the spacer comprises electrically insulating protrusions that project beyond the second surface of the mounting substrate in a direction away from the optical sub-assembly.

3. The optoelectronic module of claim 1 wherein the mounting substrate comprises a lead frame, printed circuit board or ceramic board having conductive wiring.

* * * * *